(12) United States Patent
Cheng et al.

(10) Patent No.: US 11,076,498 B1
(45) Date of Patent: Jul. 27, 2021

(54) FIXING DEVICE

(71) Applicant: Compal Electronics, Inc., Taipei (TW)

(72) Inventors: Chen-Hsien Cheng, Taipei (TW);
Li-Fang Chen, Taipei (TW);
Ruei-Hong Hong, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 17/016,404

(22) Filed: Sep. 10, 2020

(30) Foreign Application Priority Data

Jun. 19, 2020 (TW) .................................. 109120683

(51) Int. Cl.
*H05K 5/02* (2006.01)
*H05K 5/00* (2006.01)

(52) U.S. Cl.
CPC ......... *H05K 5/0221* (2013.01); *H05K 5/0065* (2013.01); *H05K 5/0247* (2013.01); *H05K 5/0256* (2013.01)

(58) Field of Classification Search
CPC .. H05K 5/0065; H05K 5/0247; H05K 5/0256; H05K 5/0221
See application file for complete search history.

(56) References Cited

U.S. PATENT DOCUMENTS

| | | | | |
|---|---|---|---|---|
| 6,840,801 B1* | 1/2005 | Behl | ....................... | G06F 1/183 439/541.5 |
| 2003/0035278 A1* | 2/2003 | Lawlyes | .............. | H05K 5/0065 361/796 |
| 2006/0216965 A1* | 9/2006 | Yamanashi | ......... | B60R 16/0238 439/76.1 |
| 2013/0288527 A1* | 10/2013 | Craig | ....................... | H02B 1/20 439/620.21 |
| 2015/0043173 A1* | 2/2015 | Yoon | ..................... | H05K 7/1457 361/729 |
| 2015/0146348 A1* | 5/2015 | Liao | ....................... | H02J 7/0044 361/679.01 |
| 2017/0117108 A1* | 4/2017 | Richardson | .......... | H05K 5/0017 |
| 2019/0098778 A1* | 3/2019 | Pandey | ................ | H05K 5/0065 |
| 2019/0281712 A1* | 9/2019 | Cheng | .................. | H05K 5/0013 |
| 2019/0307002 A1* | 10/2019 | Tessier | ..................... | H04N 5/64 |

* cited by examiner

*Primary Examiner* — Hung V Ngo

(57) ABSTRACT

A fixing device used with an electronic device having a base includes a housing and two pressing elements. The housing includes an accommodating space for accommodating the base. Each pressing element includes a pressing portion and a latch portion. The pressing portions protrude from opposite sides of the housing, and the latch portions protrude from a bottom of the accommodating space. The base includes two positioning structures corresponding to the latch portions. When the electronic device is in the locked state, the base is accommodated in the accommodating space, and the positioning structure and the latch portion are coupled so the electronic device is fixed in the accommodating space. When the electronic device is in the unlocked state, the pressing portions are simultaneously subjected to external opposing forces, and the positioning structure is uncoupled from the latch portion so the electronic device can be disassembled from the accommodating space.

31 Claims, 12 Drawing Sheets

FIXING DEVICE

FIELD OF THE INVENTION

The present invention relates to a fixing device, and more particularly to a fixing device which can be coupled and assembled by a base of an electronic device.

BACKGROUND OF THE INVENTION

With the rapid development of technology, many baby monitors or baby cams have appeared on the market, which use dynamic recording to capture dynamic images (Video) of babies, stream them through web pages or video streams for users to view.

Generally, a baby monitor or a baby cam is arranged on the bed frame of the baby bed and continuously shoots images of the baby at close range. Because the baby monitor or baby cam has a certain weight, it will easily cause harm to the baby lying on the baby bed if it is accidentally dropped on the baby bed. Therefore, Therefore, how to make the baby monitor or baby cam can be safely and firmly coupled with the baby bed so as not to fall due to accidental touch is currently pursued by the industry.

SUMMARY OF THE INVENTION

The present invention provides a fixing device, which is coupled with a base of an electronic device, has high stability and can guarantee high safety in use. The electronic device may be a product such as the above-mentioned baby cam or monitor.

The present invention provides a fixing device, which can maintain the configuration stability of a transmission line of the electronic device, thereby avoiding bending and damage of the transmission line.

The fixing device provided by the present invention is adapted to use with an electronic device. The electronic device includes a base. The fixing device includes a housing and a pair of pressing elements. The housing includes an accommodating space for accommodating the base. The pressing elements are disposed in the housing. Each of the pressing elements includes a pressing portion and a latch portion. The two pressing portions protrude from opposite sides of the housing, and the two latch portions protrude from a bottom side of the accommodating space. The base of the electronic device includes two positioning structures respectively corresponding to the two latch portions. The electronic device has a locked state and an unlocked state. When the electronic device is in the locked state, the base is accommodated in the accommodating space, and the positioning structure and the respective latch portion are coupled to each other, so that the electronic device is fixed in the accommodating space. When the electronic device is to be in the unlocked state, the two pressing portions are simultaneously subjected to external opposing forces to move toward an inside of the housing, the positioning structure is uncoupled from the respective latch portion, so that the electronic device can move and disassembled from the accommodating space.

In an embodiment of the present invention, the fixing device further includes a reset element disposed in the housing. Two ends of the reset element touch the pair of pressing elements respectively. The two pressing portions are simultaneously subjected to external opposing forces to move toward the inside of the housing and compress the reset element when the electronic device is in the unlocked state.

In an embodiment of the present invention, the housing includes a bottom and a side wall. The side wall is connected to the bottom. The bottom includes a bearing surface and a back surface opposite to each other. The bearing surface constructs the accommodating space, and there is an internal space between the bearing surface and the back surface.

In an embodiment of the present invention, two hollow protrusions are formed on the bearing surface. Each of the two hollow protrusions is provided with a slot facing the respective pressing portion. The latch portion penetrates the respective hollow protrusion and is exposed through the respective slot.

In an embodiment of the present invention, the housing includes a front cover and a back cover assembled with each other. The front cover includes the bearing surface and the side wall. The back cover includes the back surface. In an embodiment, the back cover includes an inner surface facing the front cover and an inner side wall connected to the inner surface. The side wall of the front cover includes an enclosed space. The inner side wall is disposed in the enclosed space.

In an embodiment of the present invention, two opposite openings are respectively provided on opposite sides of the inner side wall. A limiting structure and two sliding groove structures are formed on the inner surface. The limiting structure is located between the two sliding groove structures. The two sliding groove structures respectively correspond to and communicate with the two openings.

In an embodiment of the present invention, the limiting structure includes at least two ribs. The at least two ribs are arranged parallel on the inner surface and extend along a first direction. There is a limiting space between the at least two ribs and the inner surface.

In an embodiment of the present invention, the reset element includes a zigzag spring disposed between the at least two ribs. A plurality of peaks and a plurality of troughs of the zigzag spring are placed in the limiting space.

In an embodiment of the present invention, opposite sides of the side wall of the front cover includes two opposing notches corresponding to the two openings of the back cover respectively. The pressing portion of the respective pressing element protrudes from the housing through the respective notch and the respective opening.

In an embodiment of the present invention, each of the pair of pressing elements includes a base portion, the latch portion and the pressing portion. The base portion is provided in the internal space. The latch portion and the pressing portion are provided on the base portion.

In an embodiment of the present invention, the latch portion includes a body portion and a hook portion. The body portion is fixed to the base portion and extends and protrudes from the base portion in a third direction. The hook portion is disposed at an end of the body portion away from the base portion and facing the respective pressing portion.

In an embodiment of the present invention, the reset element is mounted on the limiting structure along a first direction. The base portion of the respective pressing element is slidably disposed in the respective slide groove structure. Two ends of the reset element respectively abut against the base portions of the pair of pressing elements.

In an embodiment of the present invention, each of the base portions includes a first platform portion and a second platform portion. The first platform portion and the respective second platform portion are connected along the first direction. An end of the first platform portion away from the respective second platform portion is connected to the respective pressing portion. An end of the second platform portion away from the respective first platform portion abuts against the reset element.

In an embodiment of the present invention, the first platform portion and the second platform portion respectively have a first width and a second width along a second direction. The second width is smaller than the first width.

In an embodiment of the present invention, the pressing portion is stepped and includes an inner section, a connection section and an outer section connected in sequence. The inner section is disposed at an end of the respective first platform portion away from the respective second platform portion. The inner section and the outer section extend along a third direction.

In an embodiment of the present invention, an end of the outer section away from the respective connection section has an arc-shaped edge. A plurality of reinforcing ribs is provided between the outer section and the respective connection section.

In an embodiment of the present invention, the fixing device further includes a rear cover and a pressing member. The rear cover is used to accommodate the housing. The pressing member is used to forcibly fasten the rear cover to a bracket.

In an embodiment of the present invention, the rear cover includes an accommodating portion and a sleeve portion communicating with each other. The accommodating portion accommodates the housing. The sleeve portion is adapted to sleeve the bracket. The sleeve portion includes a plurality of clamping structures, and the pressing member presses the clamping structures to fix the rear cover to the bracket.

In an embodiment of the present invention, the base of the electronic device includes a bottom surface. A concave portion is provided on the bottom surface. The two positioning structures are respectively disposed on opposite sides of the concave portion.

In an embodiment of the present invention, a wiring groove is provided on one side of the housing, and the wiring groove extends to the accommodating space.

In an embodiment of the present invention, the base of the electronic device includes a bottom surface and an annular side wall. A concave portion is provided on the bottom surface. A wire groove is provided on a side wall of the concave portion. The concave portion is adapted to communicate with the wiring groove when the base is accommodated in the accommodating space.

In an embodiment of the present invention, the concave portion includes a first side wall and a second side wall. A guide groove is formed on the second side wall and penetrates to the annular side wall. The wire groove is formed on the first side wall. The wire groove corresponds to the guide groove. The guide groove and the wiring groove are aligned and communicated when the base is accommodated in the accommodating space.

The fixing device provided by the present invention is adapted to use with an electronic device. The electronic device includes a base. The fixing device includes a housing. The housing includes an accommodating space for accommodating the base. A wiring groove is provided on one side of the housing. The wiring groove extends to the accommodating space. A concave portion is provided on a bottom surface of the base of the electronic device. A wire groove is provided on a side wall of the concave portion. The concave portion is adapted to communicate with the wiring groove when the base is accommodated in the accommodating space.

In an embodiment of the present invention, the base further includes an annular side wall connected to the bottom surface. The concave portion includes a first side wall and a second side wall. The wire groove is formed on the first side wall. A guide groove is formed on the second side wall. The guide groove penetrates the annular side wall. The wire groove corresponds to the guide groove.

In an embodiment of the present invention, the guide groove and the wiring groove are aligned and communicated when the base is accommodated in the accommodating space.

In an embodiment of the present invention, one end of a transmission line is adapted to be disposed along the wiring groove and the guide groove, enter the concave portion through the guide groove, cross the concave portion, pass through the wire groove and electrically connected to the electronic device.

In an embodiment of the present invention, the fixing device further includes a rear cover and a pressing member. The rear cover is used to accommodate the housing. The pressing member is used to forcibly fasten the rear cover to a bracket. In an embodiment, the rear cover includes an accommodating portion and a sleeve portion communicating with each other. The accommodating portion accommodates the housing. The sleeve portion is adapted to sleeve the bracket. The sleeve portion includes a plurality of clamping structures. The pressing member presses the clamping structures to fix the rear cover to the bracket. In an embodiment, a guide notch is formed at an edge of the rear cover. The guide notch corresponds to and communicates with the wiring groove.

In an embodiment of the present invention, a transmission line is adapted to penetrate into the bracket. One end of the transmission line passes through the guide notch of the rear cover, enters the concave portion of the base along the wiring groove and the guide groove, crosses the concave portion, passes through the wire groove, and is electrically connected to the electronic device.

In the present invention, it needs to apply force to the two pressing portions at the same time to detach the positioning structure of the base from the latch portion of the fixing device for unlocking, so it can be beneficial to protect the electronic device from accidentally drop due to pressing on one of the pressing portions of the fixing device. In addition, the design of the wiring groove of the housing of the fixing device and the wire groove of the base can avoid the occurrence of bending damage to the transmission line when the fixing device is coupled with the base.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
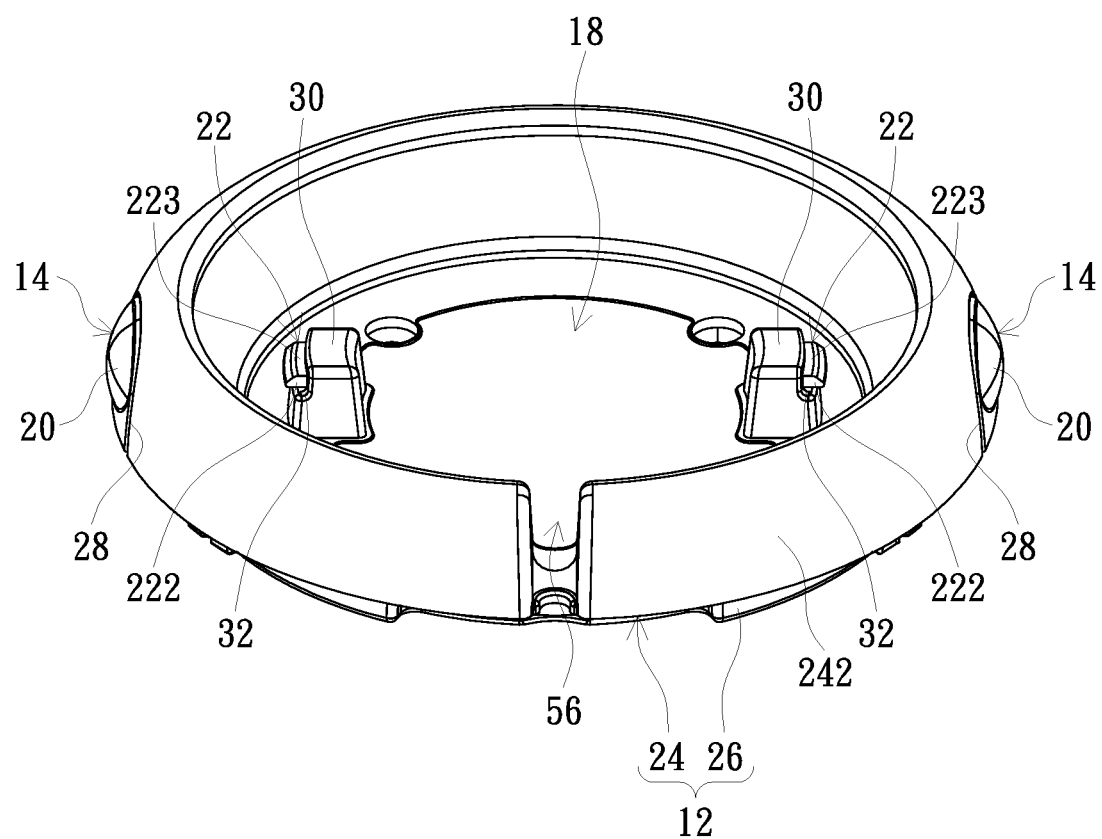
FIG. 1 is a schematic structural view of a fixing device according to an embodiment of the present invention.
Figure 2:
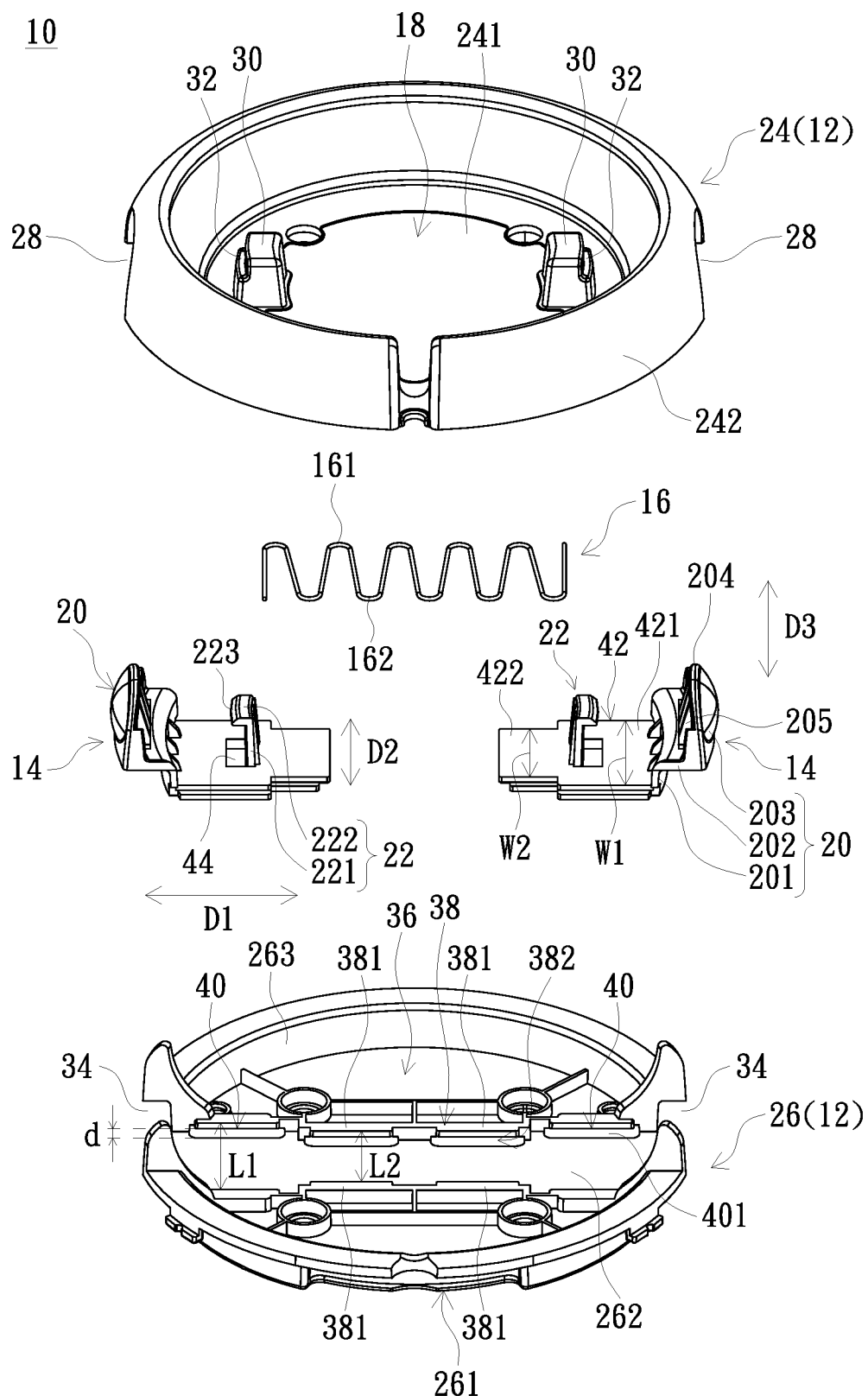
FIG. 2 is a schematic exploded view of a fixing device according to an embodiment of the present invention.
Figure 3:
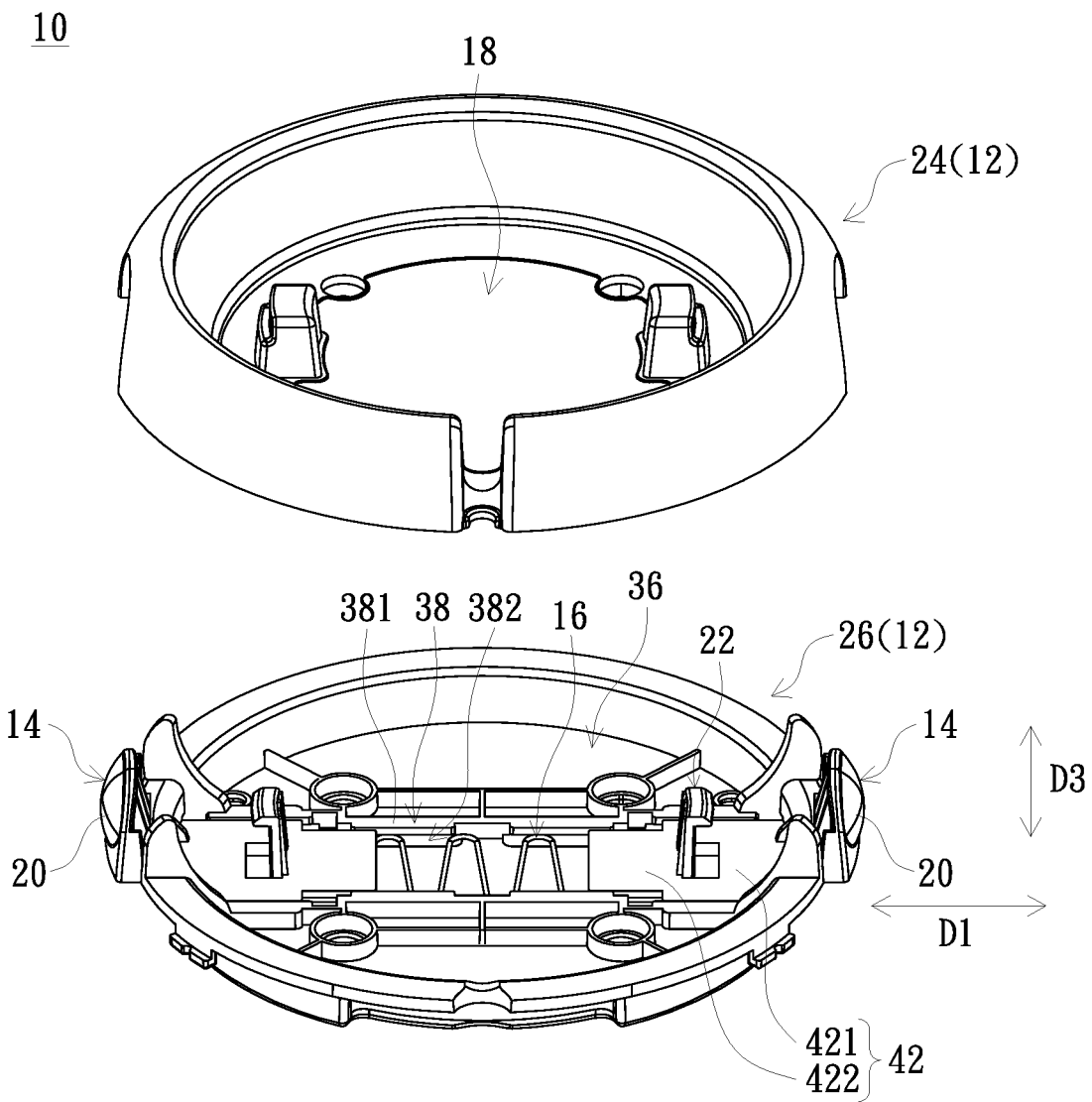
FIG. 3 is a schematic assembly view of a reset element and a pressing element provided in a housing according to an embodiment of the present invention.

FIG. 1 is a schematic structural view of a fixing device according to an embodiment of the present invention, FIG. 2 is a schematic exploded view of a fixing device according to an embodiment of the present invention, and FIG. 3 is a schematic assembly view of a reset element and a pressing element provided in a housing according to an embodiment of the present invention. As shown in FIGS. 1, 2 and 3, the fixing device 10 includes a housing 12, two pressing elements 14 and a reset element 16. The housing 12 has an accommodating space 18 for accommodating a base 60 (shown in FIGS. 6A and 6B) of an electronic device (not shown). The electronic device may be, for example, a baby cam or a baby monitor. The two pressing elements 14 are respectively disposed on the opposite sides of the housing 12. Each of the pressing elements 14 includes a pressing portion 20 protruding from the respective side of the housing 12 and a latch portion 22 protruding from the bottom of the accommodating space 18. The reset element 16 is disposed in the housing 12 and the two ends of the reset element 16 respectively touch the two pressing elements 14. The base 60 of the electronic device includes two positioning structures 62 (labeled in FIG. 6B) respectively corresponding to the two latch portions 22. The electronic device has a locked state and an unlocked state. When the electronic device is in the locked state, the base 60 is accommodated in the accommodating space 18, and the positioning structures 62 and the latch portions 22 are coupled to each other, so as to fix the electronic device in the accommodating space 18. When the electronic device is to be in the unlocked state, the two pressing portions 20 are simultaneously subjected to external opposing forces to move toward the inside of the housing 12 and compress the reset element 16, and the positioning structures 62 are uncoupled from the latch portions 22, so as to movably disassemble and separate the electronic device from the accommodating space 18.

Refer to FIG. 2. Specifically, the hosing 12 includes a front cover 24 and a back cover 26 that can be assembled with each other. The front cover 24 includes a bearing surface 241 and a side wall 242. The bearing surface 241 is concave to construct the accommodating space 18 for accommodating the base 60. The side wall 242 is disposed around the periphery of the bearing surface 241 to construct an enclosed space (unlabeled). The side wall 242 has two notches 28 on the two opposite sides. Two hollow protrusions 30 are formed on the bearing surface 241. Each of the two hollow protrusions 30 is provided with a slot 32 facing the respective notch 28. The back cover 26 includes a back surface 261, an inner surface 262 and an inner side wall 263. The inner surface 262 faces the front cover 24, the inner side wall 263 is disposed around the inner surface 262, and two openings 34 are provided on opposite sides of the inner side wall 263. When the front cover 24 and the back cover 26 are assembled with each other, the inner side wall 263 is disposed in the enclosed space, each notch 28 corresponds to the respective opening 34, and an internal space 36 is constructed between the bearing surface 241 of the front cover 24 and the back surface 261 of the back cover 26.

Follow the above description. The inner surface 262 of the back cover 26 is formed with a limiting structure 38 and two sliding groove structures 40. The limiting structure 38 is located between the two sliding groove structures 40, and each of the two sliding groove structures 40 corresponds to the respective opening 34. In an embodiment, the limiting structure 38 includes a plurality of ribs 381 arranged parallel on the inner surface 262 and extending along the first direction D1. There is a gap d between the rib 381 and the inner surface 262 to form a limiting space 382. Each of the two sliding groove structures 40 includes two corresponding sliding grooves 401, and the two corresponding sliding grooves 401 of each sliding groove structure 40 extend along the first direction D1 and communicate with the respective opening 34. In an embodiment, the gap L1 between the two corresponding sliding grooves 401 is slightly greater than the gap L2 between the parallel ribs 381.

As shown in FIG. 3, the reset element 16 is positioned in the internal space 36 of the housing 12 by the limiting structure 38. In an embodiment, the reset element 16 is an elastic zigzag spring, which includes a plurality of peaks 161 (labeled in FIG. 2) and a plurality of troughs 162 (labeled in FIG. 2). The peaks 161 and the troughs 162 are disposed in the limiting space 382 to limit the reset element 16 in the third direction D3 by the ribs 381 without affecting the action of the reset element 16 being compressed in the first direction D1 or returning to the original position via the elastic restoring force.

Follow the above description. As shown in FIGS. 2 and 3, the two pressing elements 14 are respectively provided at the two ends of the reset element 16. Specifically, each of the pressing elements 14 includes a base portion 42, a latch portion 22 and a pressing portion 20. The latch portion 22 and the pressing portion 20 are disposed on the base portion 42. In an embodiment, the base portion 42 includes a first platform portion 421 and a second platform portion 422. The first platform portion 421 and the second platform portion 422 are connected along the first direction D1. The end of the first platform portion 421 away from the second platform portion 422 is connected to the pressing portion 20. The first platform portion 421 is provided with a groove 44, but not limited to thereto. The groove 44 may also be provided on the second platform portion 422. The first platform portion 421 and the second platform portion 422 have a first width W1 and a second width W2 along the second direction D2, respectively. The second direction D2 is perpendicular to the first direction D1 and the third direction D3, and the second width W2 is smaller than the first width W1. In an embodiment, the second width W2 of the second platform portion 422 corresponds to the gap L2 of the parallel ribs 381, and the first width W1 of the first platform portion 421 corresponds to the gap L1 of the two corresponding sliding grooves 401. The opposite sides of the second platform portion 422 are slidably disposed in the limiting space 382, and the opposite sides of the first platform portion 421 are slidably disposed in the two corresponding sliding grooves 401. The pressing portion 20 is adapted to be located outside the opening 34, and the end of the second platform portion 422 away from the first platform portion 421 abuts against the reset element 16.

As shown in FIG. 2, in an embodiment, the pressing portion 20 is stepped and includes an inner section 201, a connection section 202 and an outer section 203 connected in sequence. The inner section 201 is disposed at the end of the first platform section 421 away from the second platform portion 422, and the inner section 201 and the outer section 203 extend along the third direction D3. The end of the outer section 203 away from the connection section 202 has an arc-shaped edge 204. A plurality of reinforcing ribs 205 are provided between the outer section 203 and the connection section 202.

In an embodiment, the latch portion 22 has a body portion 221 and a hook portion 222. The body portion 221 is fixed to the base 42, such as being fixed in the groove 44 of the base 42 and protruding from the groove 44 in the third direction D3. The hook portion 222 is disposed at the end of the body portion 221 away from the groove 44 and facing the pressing portion 20. The outer surface of the hook portion 222 is an inclined surface 223. As shown in FIGS. 1 and 2, when the front cover 24 and the back cover 26 are assembled with each other as the housing 12, the latch portion 22 penetrates the hollow protrusion 30 of the front cover 24 and exposes the hook portion 222 through the slot 32, and the pressing portion 20 protrudes from the housing 12 through the notch 28 of the front cover 24. In an embodiment, the front cover 24 and the back cover 26 are threaded through a plurality of screws (not shown) for locking together.

Figure 4:
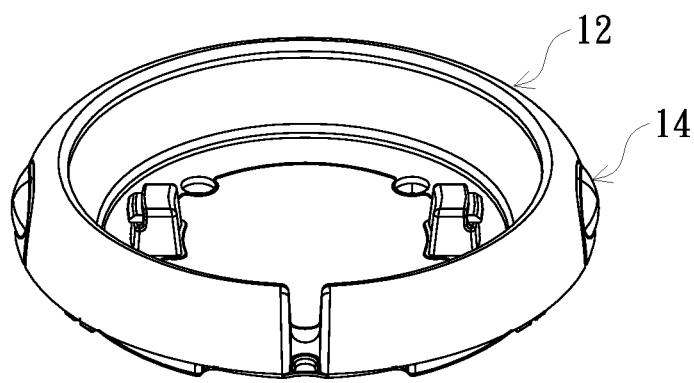
FIG. 4 is a schematic partially exploded view of a fixing device according to another embodiment of the present invention.
Figure 4:
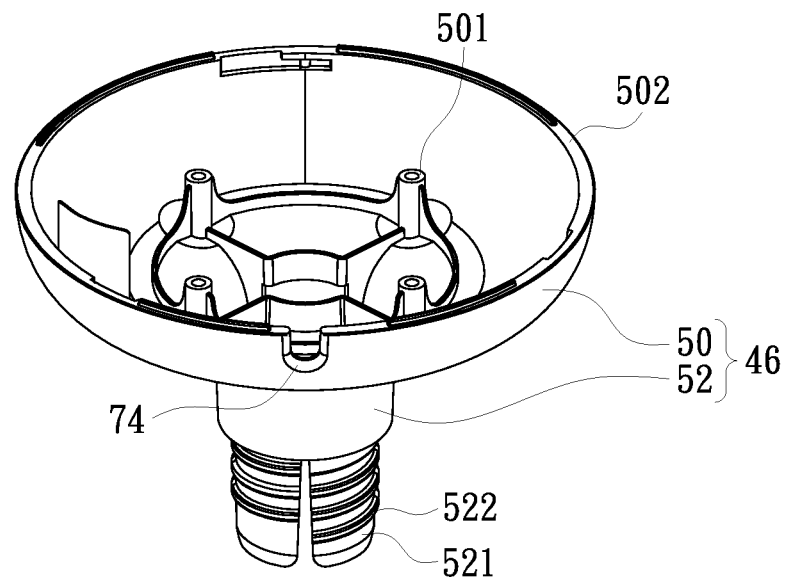
Figure 4:
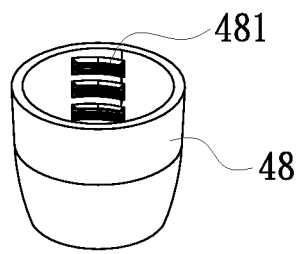
Figure 5:
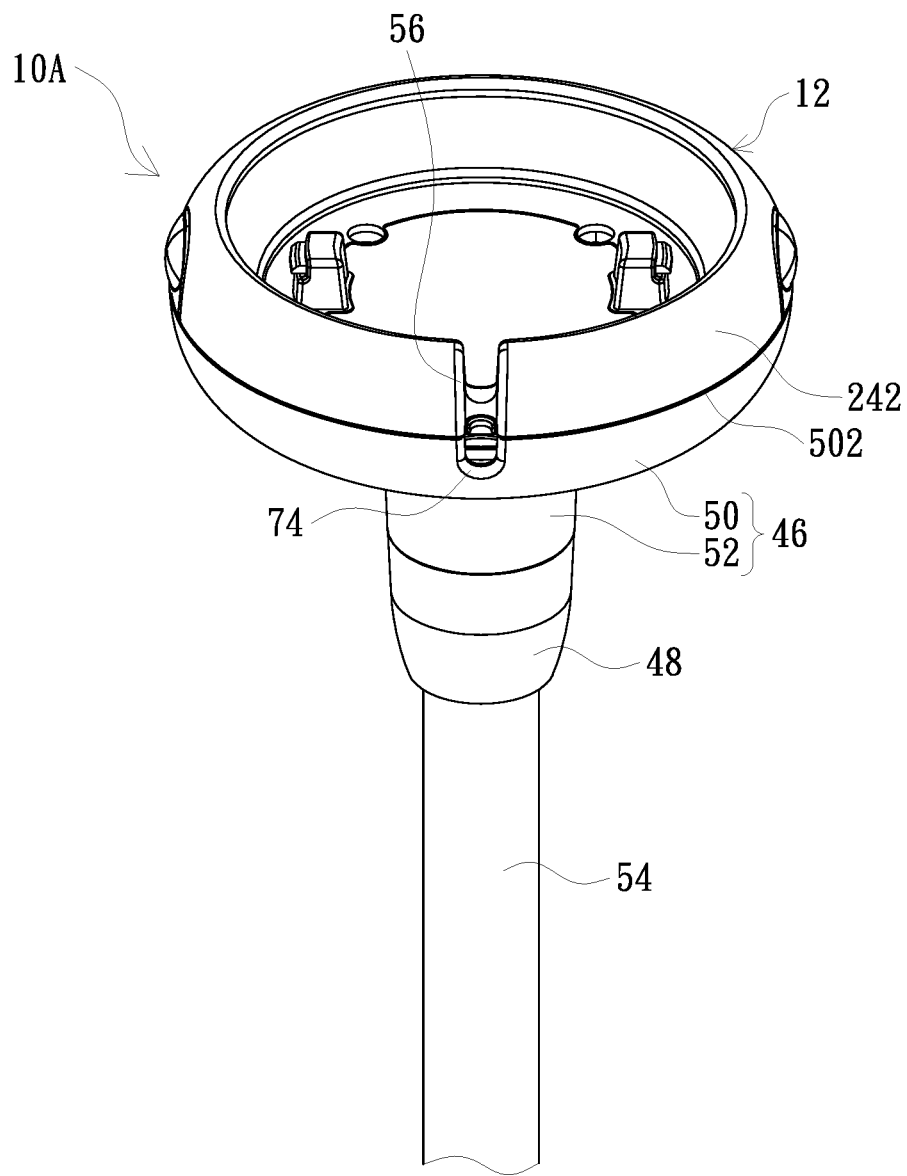
FIG. 5 is a schematic assembly view of the fixing device shown in FIG. 4 and applied to a bracket.

In the fixing device according to the embodiment of the present invention, the housing 12 can be directly locked on the wall for installing an electronic device. In other embodiments of the present invention, the housing 12 can be fixed to a bracket by other components, wherein the bracket is, for example, assembled from a plurality of upright rods and curved rods. FIG. 4 is a schematic partially exploded view of a fixing device according to another embodiment of the present invention, and FIG. 5 is a schematic assembly view of the fixing device shown in FIG. 4 and applied to a bracket. As shown in FIGS. 4 and 5, in addition to the housing 12, the pressing element 14 and the reset element 16 (labeled in FIGS. 2 and 3), the fixing device 10A further includes a rear cover 46 and a pressing member 48. The rear cover 46 is used to accommodate the housing 12, and the pressing member 48 is used to forcibly fasten the rear cover 46 to a bracket 54. In an embodiment, the rear cover 46 includes an accommodating portion 50 and a sleeve portion 52. The accommodating portion 50 is slightly bell-shaped. In an embodiment, a plurality of studs 501 is provided on the bottom side of the accommodating portion 50. The housing 12 is accommodated in the accommodating portion 50 and a plurality of screws (not shown) penetrates the housing 12 and the studs 501, so that the housing 12 is locked to the accommodating portion 50. As shown in FIG. 5, the side wall 242 of the housing 12 is adapted to contact and fit with the top edge 502 of the accommodating portion 50.

Follow the above description. The sleeve portion 52 of the rear cover 46 is disposed on the bottom of the accommodating portion 50 and communicates with the accommodating portion 52. In an embodiment, the sleeve portion 52 includes a plurality of clamping structures 521. An external thread 522 is formed on the outer surface of the clamping structure 521. The pressing member 48 is slightly hollow cylindrical. An internal thread 481 is formed on the inner wall of the pressing member 48, and the internal thread 481 can be matched with the external thread 521. When the rear cover 46 is assembled with the bracket 54, the sleeve portion 52 is sleeved on one end of the bracket 54 so that the clamping structures 521 are disposed on the outer surface of the bracket 54. Further, the pressing member 48 is screwed on the clamping structures 521 and the pressing member 48 is rotated to force the clamping structures 521 to be tightly coupled with the bracket 54, so that the rear cover 46 is fixed to the bracket 54.

Figure 6A:
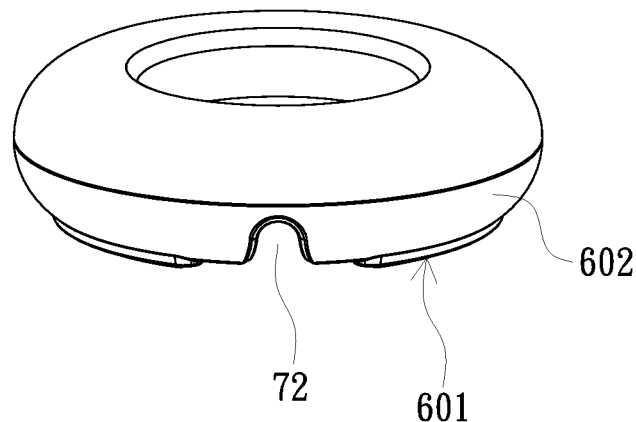
FIGS. 6A and 6B are schematic views of a base of an electronic device shown in different angles, wherein the electronic device is applied by a fixing device according to an embodiment of the present invention.
Figure 6B:
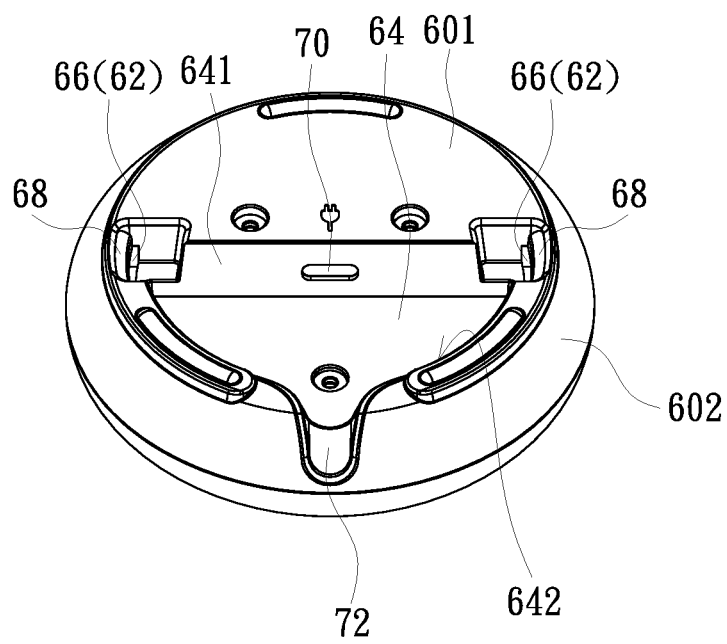
Figure 6C:
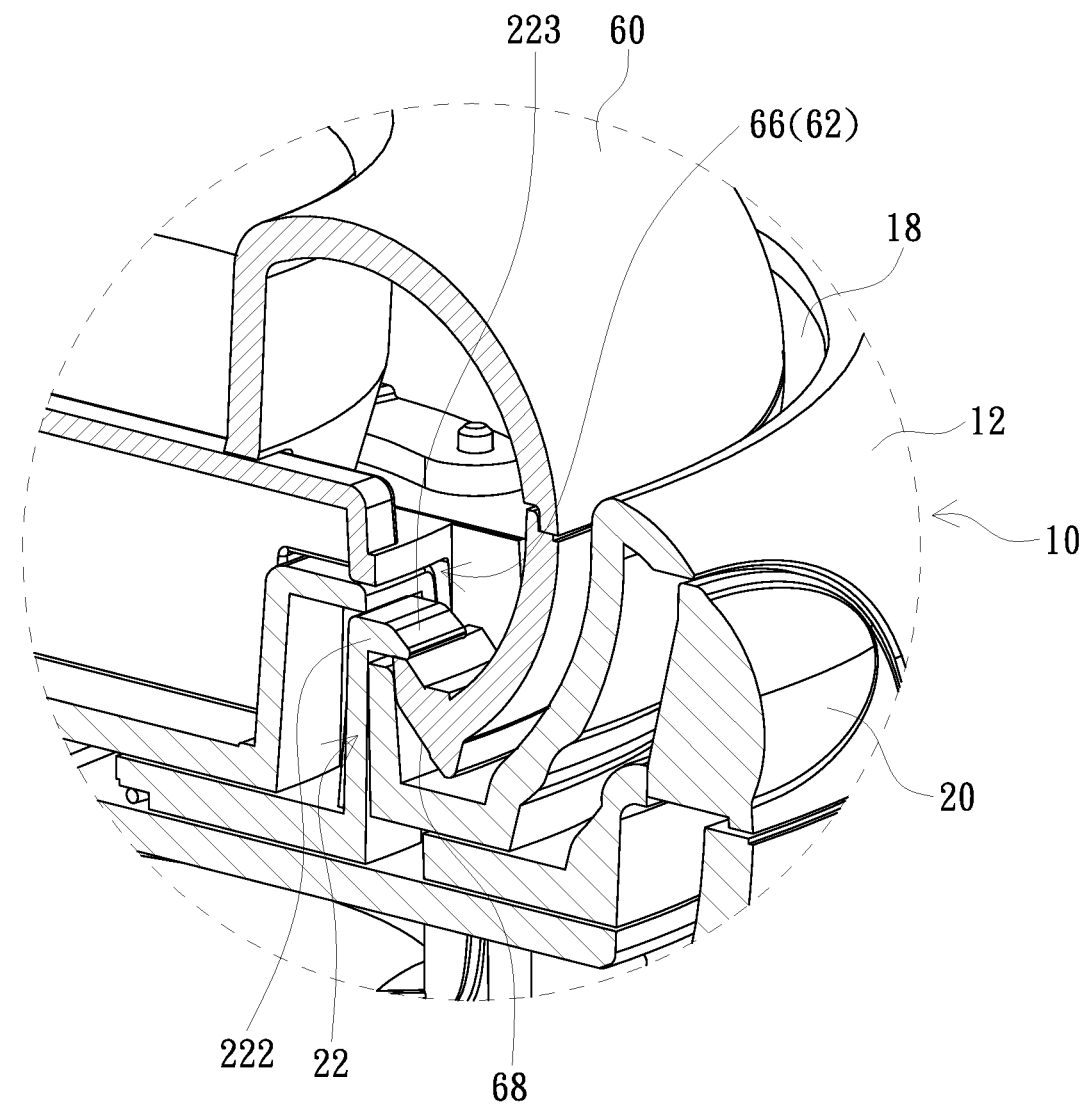
FIG. 6C is a schematic partial perspective cross-sectional view of a couple of the base of the electronic device and the fixing device according to an embodiment of the present invention.

In the fixing device 10/10A of the embodiment of the present invention, an electronic device can be easily assembled with and disassembled from the fixing device 10/10A regardless of whether the fixing device 10/10A is mounted on the wall or the bracket 54, wherein the electronic device is, for example, a cam or a monitor equipment with a base. FIGS. 6A and 6B are schematic views of a base of an electronic device shown in different angles, wherein the electronic device is applied by a fixing device according to an embodiment of the present invention, and FIG. 6C is a schematic partial perspective cross-sectional view of a couple of the base of the electronic device and the fixing device according to an embodiment of the present invention. As shown in FIGS. 6A and 6B, the base 60 has a bottom surface 601, an annular side wall 602 and a positioning structure 62. In an embodiment, the bottom surface 601 is provided with a concave portion 64. The concave portion 64 has, for example, a semi-circular shape and has a first side wall 641 and a second side wall 642. The first side wall 641 is, for example, a straight flat side wall perpendicular to the bottom surface 601, and the second side wall 642 is, for example, an arc-shaped side wall along the annular side wall 602. The positioning structure 62 includes two clamping grooves 66 respectively disposed at the two ends of the second side wall 642 and adjacent to the first side wall 641. A matching slope 68 is formed on the bottom surface 601 and adjacent to the clamping groove 66. In an embodiment, the matching slope 68 can interfere with the inclined surface 223 of the hook portion 222 of the latch portion 22 (labeled in FIG. 1).

Follow the above description. Please refer to FIGS. 1, 6B and 6C together. When the base 60 is to be coupled with the fixing device 10 in order to keep the electronic device in a locked state, the two clamping grooves 66 or the two matching slopes 68 of the base 60 are aligned with the latch portion 22 of the fixing device 10. Therefore, by the interference between the matching slopes 68 and the inclined surface 223 of the hook portion 222 of the latch portion 22, the hook portion 222 is slid into and latched in the clamping grooves 66. Thus, through the couple of the latch portion 22 and the positioning structure 62, the base 60 is accommodated in the accommodating space 18 of the housing 12 and coupled with the housing 12.

When the base 60 is to be detached from the accommodating space 18, the user simultaneously applies pressure to the two pressing portions 20, so that the two pressing portions 20 are simultaneously subjected to external opposing forces and both face the internal space 36 (labeled in FIG. 2) to move, so that the base 42 (labeled in FIG. 3) connected to the pressing portion 20 compresses the reset element 16 (labeled in FIG. 3) and causes the latch portion 22 to move in the first direction D1 away from the respective clamping groove 66. Thus, the clamping grooves 66 and the latch portion 22 are detached from each other, and the base 60 can be detached and separated from the accommodating space 18. Further, after the base 60 is detached from the accommodating space 18, the compressed reset element 16 is no longer subjected to external force, so the pressing element 14 is pushed back to the original position by the elastic restoring force of the reset element 16 to facilitate the next time assemble with the base 60 of the electronic device.

In the fixing device 10/10A of the embodiment of the present invention, the user can easily lock the base 60 of an electronic device and the fixing device 10/10A together. It is necessary to simultaneously apply force to the two pressing portions 20 when the base 60 is to be detached and unlocked from the fixing device 10/10A, which will help protect the electronic device from accidentally dropping due to one of the pressing portions 20 of the fixing device 10/10A, so it can ensure the stability of the couple and have a high security for use.

Figure 7:
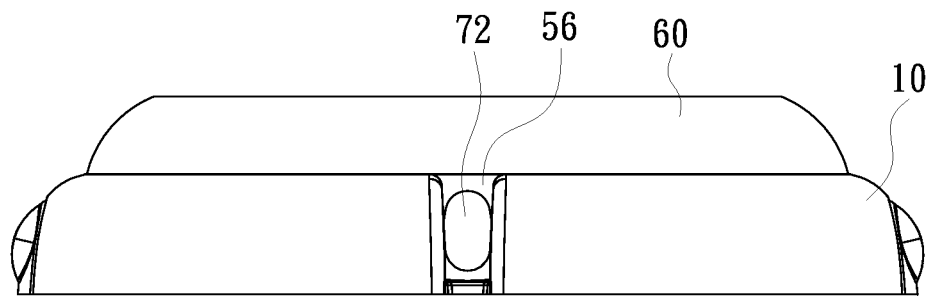
FIG. 7 is a schematic view of the couple of the base and the fixing device according to an embodiment of the present invention.

On the other hand, in order to avoid bending damage of the transmission line electrically connected to the electronic device while the fixing device 10/10A is coupled with the base 60 of the electronic device, the fixing device 10/10A according to an embodiment of the present invention further includes a wiring structure. Please refer to FIG. 1 again, in which the fixing device 10 without the rear cover is took as an example. The fixing device 10 includes a housing 12 having an accommodating space 18 to accommodate the base. A wiring groove 56 is provided on one side of the housing 12, and the wiring groove 56 penetrates the side wall 242 of the housing 18 to extend to the accommodating space 18. As shown in FIG. 6B, a wire groove 70 is provided on the base 60. Specifically, the base 60 includes a bottom surface 601 and an annular side wall 602. The bottom surface 601 is provided with a concave portion 64. The concave portion 64 is, for example, semi-circular and has a first side wall 641 and a second side wall 642. The wire groove 70 is formed at the center of the first side wall 641. Preferably, a guide groove 72 is further formed on the second side wall 642 to increase the stability of the wiring. The guide groove 72 is formed at the center of the second side wall 642 and penetrates into the annular side wall 602. In an embodiment, the guide groove 72 and the wire groove 70 are oppositely provided. FIG. 7 is a schematic view of the couple of the base and the fixing device according to an embodiment of the present invention. As shown in FIG. 7, the guide groove 72 corresponds to the wiring groove 56 and is exposed through the wiring groove 56 when the base 60 is coupled with the fixing device 10.

Further, as shown in FIGS. 4 and 5, the fixing device 10A includes a rear cover 46 and a pressing member 48. The housing 12 is fixed to the bracket 54 by the rear cover 46 and the pressing member 48. A guide notch 74 is formed on the top edge 502 of the rear cover 46. When the housing 12 is coupled with the rear cover 46, the side wall 242 of the housing 12 is adapted to touch and fit with the top edge 502 of the rear cover 46, and the guide notch 74 communicates with the wiring groove 56.

Figure 8A:
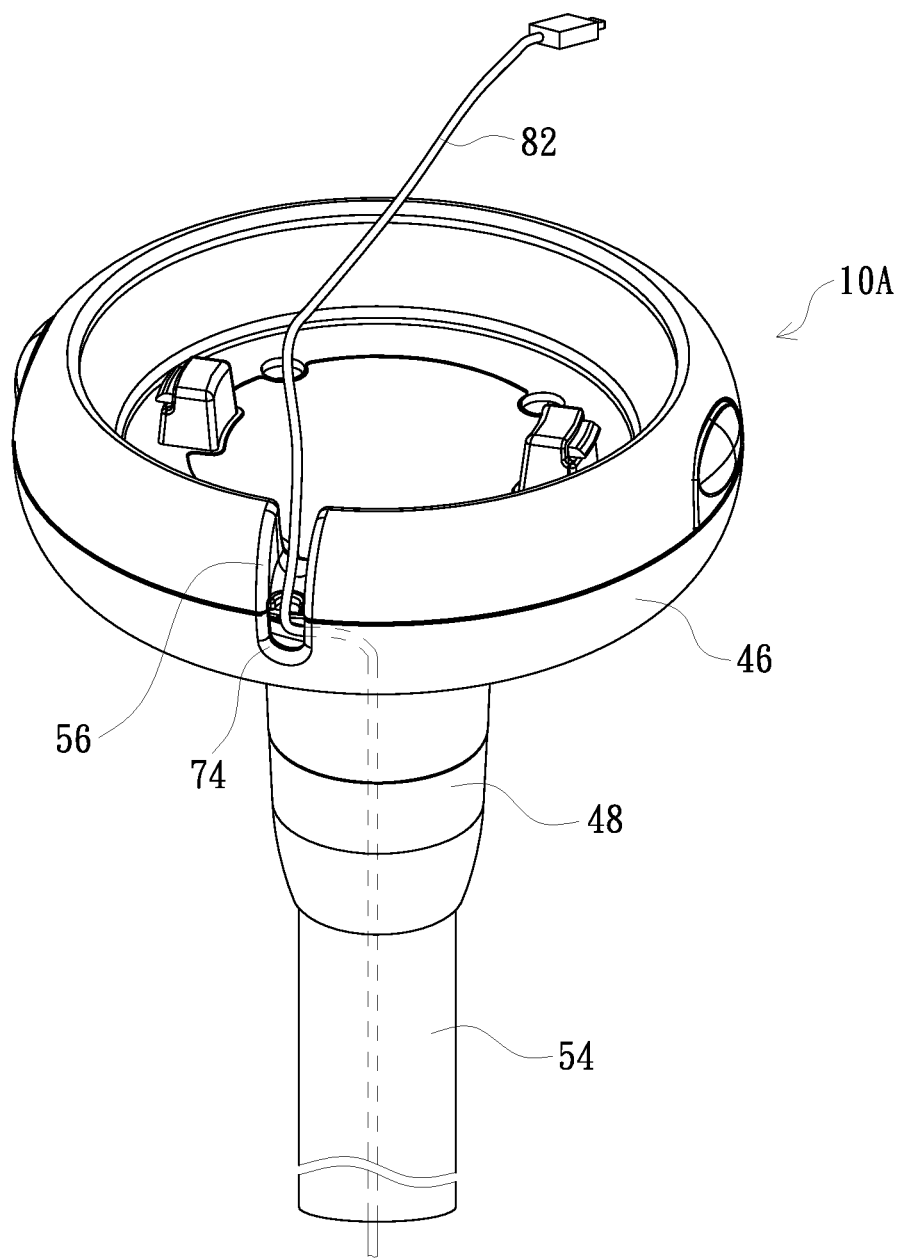
FIGS. 8A to 8D are schematic views of an assembly process between a transmission line, a fixing device and a base according to an embodiment of the present invention.
Figure 8B:
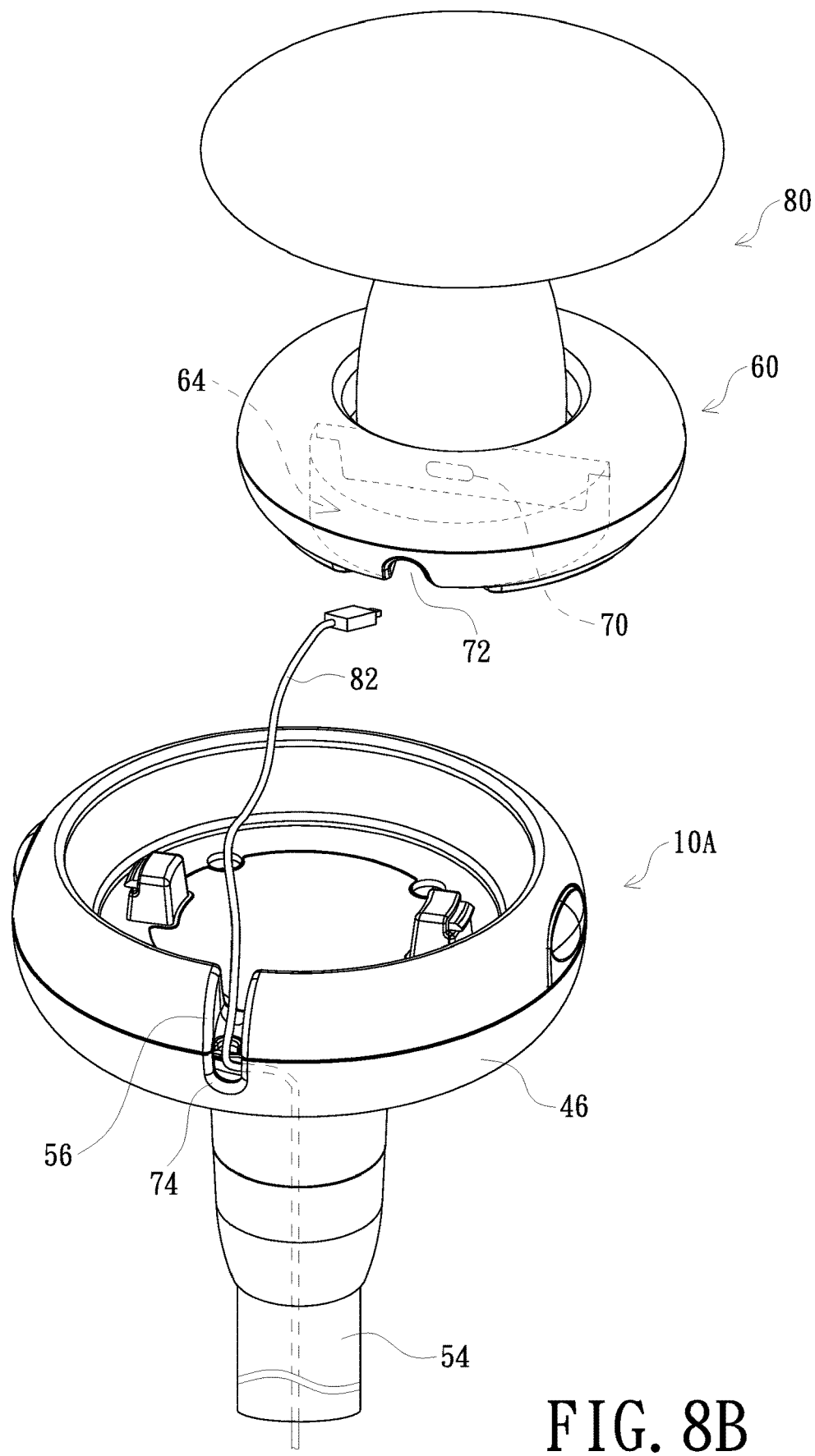
Figure 8C:
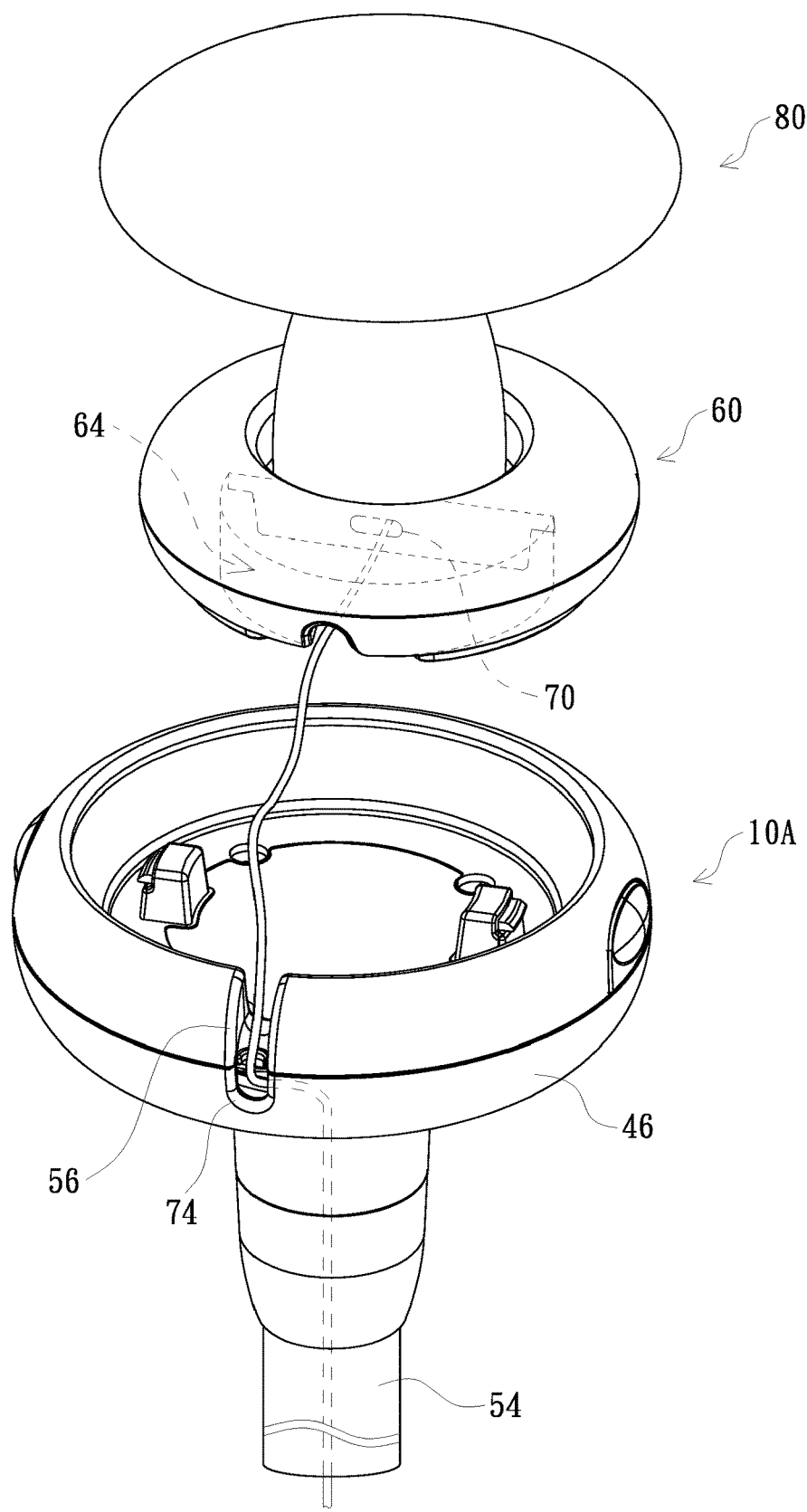
Figure 8D:
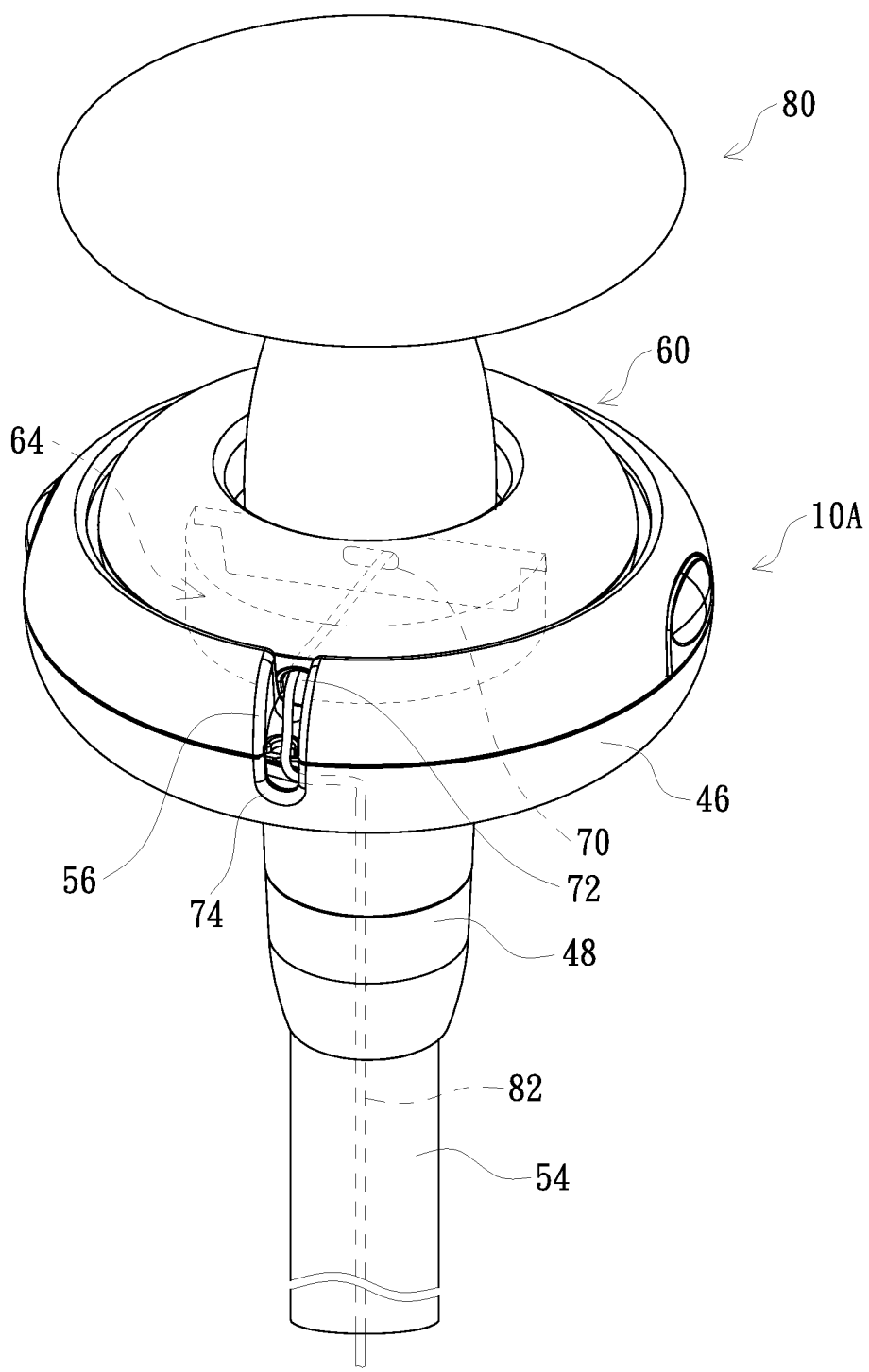

FIGS. 8A to 8D are schematic views of an assembly process between a transmission line, a fixing device and a base according to an embodiment of the present invention. In FIGS. 8A to 8D, the fixing device 10A having a rear cover 46 and a pressing member 48 is taken as an example. As shown in FIG. 8A, the transmission line 82 to be electrically connected to the electronic device 80 is inserted into the bracket 54, and one end of the transmission line 54 passes through the guide notch 74 of the rear cover 46 and is limited by the wiring groove 56. Then, as shown in FIG. 8B, the electronic device 80 is adjacent to the upper side of the fixing device 10A, and the transmission line 82 enters the concave portion 64 of the base 60 along the guide groove 72 of the base 60. Then, as shown in FIG. 8C, the transmission line 82 crosses the concave portion 64 to pass through wire groove 70 to electrically connect to the electronic device 80. Then, as shown in FIG. 8D, the base 60 of the electronic device 80 and the fixing device 10A are assembled together. In an embodiment, with the assembly of the base 60 and the fixing device 10A, part of the transmission line 82 may be bent and collected in the concave portion 64 of the base 60. At this time, the transmission line 82 exposed at the bottom end of the bracket 54 may be pulled down to eliminate the collection of part of the transmission line 82 in the concave portion 64 to prevent the transmission line 82 from being easily damaged by bending. Wherein, by the guide of the wiring groove 56 and the guide groove 72, the transmission line 82 originally penetrating the bracket 54 longitudinally can pass through the concave portion 64 with nearly horizontal wiring and penetrate into the wire groove 70 to connect with the output/input connection port of the electronic device 80. In this way, the transmission line 80 is not easily loosened from the connection port by the gravity due to vertical penetration. In addition, the arrangement of the wiring groove 56 and the guide groove 72 can further maintain the stability of the transmission line 82 and thereby avoid bending and damage of the transmission line 82.

In the fixing device and the base of the embodiment of the present invention, the design of the wiring groove, the guide groove and the wire groove can avoid the occurrence of bending damage to the transmission line when the fixing device is coupled with the base. Further, optionally, the design of the wiring groove can be combined with the above-mentioned embodiments with a pressing element and a reset element, so as to easily lock the fixing device and the base and avoid the electronic device from falling due to accidental touch, and thereby having the advantage of high safety in use.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fixing device adapted to use with an electronic device, the electronic device comprising a base, and the fixing device comprising:
   a housing, comprising an accommodating space for accommodating the base; and
   a pair of pressing elements, disposed in the housing, wherein each of the pressing elements comprises a pressing portion and a latch portion, the two pressing portions protrude from opposite sides of the housing, and the two latch portions protrude from a bottom side of the accommodating space;
   wherein the base of the electronic device comprises two positioning structures respectively corresponding to the two latch portions, and the electronic device has a locked state and an unlocked state,
   wherein when the electronic device is in the locked state, the base is accommodated in the accommodating space, the positioning structure and the respective latch portion are coupled to each other, so that the electronic device is fixed in the accommodating space, when the electronic device is in the unlocked state, the two pressing portions are simultaneously subjected to external opposing forces to move toward an inside of the housing, the positioning structure is uncoupled from the respective latch portion, so that the electronic device can move and disassembled from the accommodating space.

2. The fixing device according to claim 1, further comprising a reset element disposed in the housing, wherein two ends of the reset element touch the pair of pressing elements respectively, and the two pressing portions are simultaneously subjected to external opposing forces to move toward the inside of the housing and compress the reset element when the electronic device is in the unlocked state.

3. The fixing device according to claim 2, wherein the housing comprises a bottom and a side wall, the side wall is connected to the bottom, the bottom comprises a bearing surface and a back surface opposite to each other, the bearing surface constructs the accommodating space, and there is an internal space between the bearing surface and the back surface.

4. The fixing device according to claim 3, wherein two hollow protrusions are formed on the bearing surface, each of the two hollow protrusions is provided with a slot facing the respective pressing portion, and the latch portion penetrates the respective hollow protrusion and is exposed through the respective slot.

5. The fixing device according to claim 3, wherein the housing comprises a front cover and a back cover assembled with each other, the front cover comprises the bearing surface and the side wall, and the back cover comprises the back surface.

6. The fixing device according to claim 5, wherein the back cover comprises an inner surface facing the front cover and an inner side wall connected to the inner surface, the side wall of the front cover comprises an enclosed space, and the inner side wall is disposed in the enclosed space.

7. The fixing device according to claim 6, wherein two opposite openings are respectively provided on opposite sides of the inner side wall, a limiting structure and two sliding groove structures are formed on the inner surface, the limiting structure is located between the two sliding groove structures, and the two sliding groove structures respectively correspond to and communicate with the two openings.

8. The fixing device according to claim 7, wherein the limiting structure comprises at least two ribs, the at least two ribs are arranged parallel on the inner surface and extend along a first direction, and there is a limiting space between the at least two ribs and the inner surface.

9. The fixing device according to claim 8, wherein the reset element comprises a zigzag spring disposed between the at least two ribs, and a plurality of peaks and a plurality of troughs of the zigzag spring are placed in the limiting space.

10. The fixing device according to claim 7, wherein opposite sides of the side wall of the front cover comprise two opposing notches corresponding to the two openings of the back cover respectively, and the pressing portion of the respective pressing element protrudes from the housing through the respective notch and the respective opening.

11. The fixing device according to claim 7, wherein each of the pair of pressing elements comprises a base portion, the latch portion and the pressing portion, the base portion is provided in the internal space, and the latch portion and the pressing portion are provided on the base portion.

12. The fixing device according to claim 11, wherein the latch portion comprises a body portion and a hook portion, the body portion is fixed to the base portion and extends and protrudes from the base portion in a third direction, and the hook portion is disposed at an end of the body portion away from the base portion and facing the respective pressing portion.

13. The fixing device according to claim 11, wherein the reset element is mounted on the limiting structure along a first direction, the base portion of the respective pressing element is slidably disposed in the respective slide groove structure, and two ends of the reset element respectively abut against the base portions of the pair of pressing elements.

14. The fixing device according to claim 13, wherein each of the base portions comprises a first platform portion and a second platform portion, the first platform portion and the respective second platform portion are connected along the first direction, an end of the first platform portion away from the respective second platform portion is connected to the respective pressing portion, and an end of the second platform portion away from the respective first platform portion abuts against the reset element.

15. The fixing device according to claim 14, wherein the first platform portion and the second platform portion respectively have a first width and a second width along a second direction, and the second width is smaller than the first width.

16. The fixing device according to claim 14, wherein the pressing portion is stepped and comprises an inner section, a connection section and an outer section connected in sequence, the inner section is disposed at an end of the respective first platform portion away from the respective second platform portion, and the inner section and the outer section extend along a third direction.

17. The fixing device according to claim 16, wherein an end of the outer section away from the respective connection section has an arc-shaped edge, and a plurality of reinforcing ribs are provided between the outer section and the respective connection section.

18. The fixing device according to claim 1, further comprising a rear cover and a pressing member, wherein the rear cover is used to accommodate the housing, and the pressing member is used to forcibly fasten the rear cover to a bracket.

19. The fixing device according to claim 18, wherein the rear cover comprises an accommodating portion and a sleeve portion communicating with each other, the accommodating portion accommodates the housing, the sleeve portion is adapted to sleeve the bracket, the sleeve portion comprises a plurality of clamping structures, and the pressing member presses the clamping structures to fix the rear cover to the bracket.

20. The fixing device according to claim 1, wherein the base of the electronic device comprises a bottom surface, a concave portion is provided on the bottom surface, and the two positioning structures are respectively disposed on opposite sides of the concave portion.

21. The fixing device according to claim 1, wherein a wiring groove is provided on one side of the housing, and the wiring groove extends to the accommodating space.

22. The fixing device according to claim 21, wherein the base of the electronic device comprises a bottom surface and an annular side wall, a concave portion is provided on the bottom surface, a wire groove is provided on a side wall of the concave portion, and the concave portion is adapted to communicate with the wiring groove when the base is accommodated in the accommodating space.

23. The fixing device according to claim 22, wherein the concave portion comprises a first side wall and a second side wall, a guide groove is formed on the second side wall and penetrates to the annular side wall, the wire groove is formed on the first side wall, the wire groove corresponds to the guide groove, and the guide groove and the wiring groove are aligned and communicated when the base is accommodated in the accommodating space.

24. A fixing device adapted to use with an electronic device, the electronic device comprising a base, and the fixing device comprising:
  a housing, comprising an accommodating space for accommodating the base, wherein a wiring groove is provided on one side of the housing, and the wiring groove extends to the accommodating space, wherein
  a concave portion is provided on a bottom surface of the base of the electronic device, a wire groove is provided on a side wall of the concave portion, and the concave portion is adapted to communicate with the wiring groove when the base is accommodated in the accommodating space.

25. The fixing device according to claim 24, wherein the base further comprises an annular side wall connected to the bottom surface, the concave portion comprises a first side wall and a second side wall, the wire groove is formed on the first side wall, a guide groove is formed on the second side wall, the guide groove penetrates the annular side wall, and the wire groove corresponds to the guide groove.

26. The fixing device according to claim 25, wherein the guide groove and the wiring groove are aligned and communicated when the base is accommodated in the accommodating space.

27. The fixing device according to claim 26, wherein one end of a transmission line is adapted to be disposed along the wiring groove and the guide groove, enter the concave portion through the guide groove, cross the concave portion, pass through the wire groove and electrically connected to the electronic device.

28. The fixing device according to claim 24, further comprising a rear cover and a pressing member, wherein the rear cover is used to accommodate the housing, and the pressing member is used to forcibly fasten the rear cover to a bracket.

29. The fixing device according to claim 28, wherein the rear cover comprises an accommodating portion and a sleeve portion communicating with each other, the accommodating portion accommodates the housing, the sleeve portion is adapted to sleeve the bracket, the sleeve portion comprises a plurality of clamping structures, and the pressing member presses the clamping structures to fix the rear cover to the bracket.

30. The fixing device according to claim 29, wherein a guide notch is formed at an edge of the rear cover, and the guide notch corresponds to and communicates with the wiring groove.

31. The fixing device according to claim 30, wherein a transmission line is adapted to penetrate into the bracket, one end of the transmission line passes through the guide notch of the rear cover, enters the concave portion of the base along the wiring groove and the guide groove, crosses the concave portion, passes through the wire groove, and is electrically connected to the electronic device.

* * * * *